(12) United States Patent
Maruyama et al.

(10) Patent No.: US 6,188,608 B1
(45) Date of Patent: Feb. 13, 2001

(54) NONVOLATILE SEMICONDUCTOR MEMORY DEVICE

(75) Inventors: Takafumi Maruyama; Makoto Kojima, both of Osaka (JP)

(73) Assignee: Matsushita Electric Industrial Co., Ltd., Osaka (JP)

(*) Notice: Under 35 U.S.C. 154(b), the term of this patent shall be extended for 0 days.

(21) Appl. No.: 09/551,662

(22) Filed: Apr. 18, 2000

(30) Foreign Application Priority Data

Apr. 23, 1999 (JP) .................................................. 11-115887

(51) Int. Cl.[7] .................................................. G11C 16/00
(52) U.S. Cl. .......................................... 365/185.2; 365/210
(58) Field of Search ................................. 365/185.2, 210, 365/230.03, 190, 185.11

(56) References Cited

U.S. PATENT DOCUMENTS

| 5,459,694 | 10/1995 | Arakawa | 365/210 |
| 5,521,868 | 5/1996 | Nobukata | 365/185.22 |
| 5,822,248 | 10/1998 | Satori et al. | 365/185.21 |
| 6,031,759 | * | 2/2000 | Ohashi | 365/185.2 |

FOREIGN PATENT DOCUMENTS

| 6-290591 | 10/1994 | (JP) . |
| 8-203291 | 8/1996 | (JP) . |
| 2573380 | 10/1996 | (JP) . |

* cited by examiner

Primary Examiner—Tan T. Nguyen
(74) Attorney, Agent, or Firm—McDermott, Will & Emery

(57) ABSTRACT

A nonvolatile semiconductor memory device includes: first and second memory cell blocks, each of the first and second memory cell blocks including at least one memory cell connected to a first word line; third and fourth memory cell blocks, each of the third and fourth memory cell blocks including at least one memory cell connected to a second word line; and an amplifier for inputting or outputting data through first and second bit lines. Each said memory cell block includes at least one dummy cell.

11 Claims, 9 Drawing Sheets

US 6,188,608 B1

NONVOLATILE SEMICONDUCTOR MEMORY DEVICE

BACKGROUND OF THE INVENTION

The present invention relates to a nonvolatile semiconductor memory device and more particularly relates to a nonvolatile semiconductor memory device like a flash memory including a differential sense amplifier.

Recently, a nonvolatile semiconductor memory device has been increasingly required to operate at higher and higher speeds. To meet such a demand, the application of a folded bit line arrangement, which is usually used for a dynamic random access memory (DRAM), has been proposed as an effective means for realizing such a high-speed operation. In the folded bit line arrangement, a bit line and its associated dummy bit line are connected in parallel to a sense amplifier. In this arrangement, reading is performed by comparing information stored in a memory cell connected to the bit line to reference information stored in an associated dummy cell connected to the dummy bit line and by amplifying a voltage difference therebetween. The arrangements of this type are disclosed in Japanese Laid-Open Publications Nos. 6-290591 and 8-203291, for example.

These folded bit line arrangements are superior to conventional opened bit line arrangements in terms of noise resistance and low power dissipation, and therefore applicable particularly effectively to circuits that should operate at higher speeds.

The present inventors analyzed the operation of a nonvolatile semiconductor memory device with the known folded bit line arrangement from various angles to find that the device of this type also has several shortcomings. Specifically, a device with the known folded bit line arrangement cannot read data from a desired memory cell accurately and rapidly enough, because there is capacitance imbalance between a bit line and its associated dummy bit line in reading out the data.

FIG. 7 illustrates a circuit configuration for a nonvolatile semiconductor memory device with the folded bit line arrangement as disclosed in Japanese Laid-Open Publication No. 8-203291 identified above. As shown in FIG. 7, the device includes sense amplifier 30, bit line BL and its complementary bit line BLB. One end of the bit line BL is connected to the sense amplifier 30 via a transfer gate 33, while the other end thereof is connected to a pre-charging transfer gate 11P. One end of the complementary bit line BLB is connected to the sense amplifier 30 via a transfer gate 34, while the other end thereof is connected to a pre-charging transfer gate 21P. First and second memory cell blocks 110a and 120a are connected to the bit line BL and the complementary bit line BLB by way of first and second select gates 11S and 22S, respectively.

The first memory cell block 110a consists of four memory cells M11a, M12a, M13a and M14a, which are connected in series together and to word lines WL1a, WL2a, WL3a and WL4a, respectively. The second memory cell block 120a also consists of four memory cells M21a, M22a, M23a and M24a, which are connected in series together and also connected to the word lines WL1a, WL2a, WL3a and WL4a, respectively. Third and fourth memory cell blocks 110b and 120b with the same configurations as the first and second memory cell blocks 110a and 120a are connected to the bit line BL and the complementary bit line BLB via third and fourth select gates 12S and 23S, respectively.

Furthermore, a first dummy cell block 110D with the same configuration as the first memory cell block 110a is connected to the bit line BL via a first dummy select gate 11D. And a second dummy cell block 120D with the same configuration as the first dummy cell block 110D is connected to the complementary bit line BLB via a second dummy select gate 21D.

Hereinafter, it will be briefly described how the nonvolatile semiconductor memory device with such an arrangement performs reading.

For example, suppose information should be read out from the memory cell M14b in the third memory cell block 110b. In such a case, reference information (i.e., a reference potential) is supplied from the dummy cells M21D and M22D to the sense amplifier 30. In the following example, the memory cell M14b is now being written, i.e., the threshold voltage of the memory cell M14b is between 1 and 2 V and the drain-source current thereof is about 80 $\mu$A. It should be noted that a memory cell is erased when a threshold voltage thereof is 8 V or more and the drain-source current thereof is 0 $\mu$A. On the other hand, the reference information stored in the dummy cells M21D and M22D, for example, is supposed to be average between a memory cell being erased and a memory cell being written.

First, the bit line BL and the complementary bit line BLB are pre-charged to a potential, which may be half of a supply potential $V_{DD}$, by way of the pre-charging transfer gates 11P and 21P, respectively. Thereafter, the word line WL4b connected to the control gate of the memory cell M14b is activated and a high-level select signal SG2 is applied to the gate of the third select gate 12S to turn the gate 12S ON. In this manner, the information is sent out from the memory cell 14b onto the bit line BL. In this case, capacitance caused by the third memory cell block 110b is applied to the bit line BL. At the same time, since the high-level select signal SG2 also turns the second select gate 22S ON, capacitance caused by the second memory cell block 120a is applied to the complementary bit line BLB.

On the other hand, the dummy cells M21D and M22D generate the reference potential to read the information from the memory cell M14b. In this case, dummy word lines DWL1 and DWL2 connected to the respective control gates of the dummy cells M21D and M22D are activated and a high-level dummy select signal DSG2 is applied to the gate of the second dummy select gate 21D to turn the gate 21D ON. In this manner, the reference information is transferred from the dummy cells M21D and M22D to the complementary bit line BLB. In this case, capacitance caused by the second dummy cell block 120D is applied to the complementary bit line BLB by way of the second dummy select gate 21D.

FIG. 8 schematically illustrates respective capacitance components applied to the bit line BL and the complementary bit line BLB while the semiconductor memory device shown in FIG. 7 is reading data. In FIG. 8, the same members as those illustrated in FIG. 7 are identified by the same reference numerals. As shown in FIG. 8, when a memory cell connected to the bit line BL is accessed, the sense amplifier 30 senses the line and diffusion capacitance CBL caused by the bit line BL and the capacitance C110b caused by the third memory cell block 110b from the bit line BL. The sense amplifier 30 also senses the line and diffusion capacitance CBLB caused by the complementary bit line BLB, the capacitance C120a caused by the second memory cell block 120a and the capacitance C120D caused by the second dummy cell block 120D from the complementary bit line BLB. In this case, the capacitance C110b or C120D includes the diffusion capacitance components of respective cells and the line capacitance caused by a sub-bit line when the drain of each cell is connected to the select gate.

As can be seen from FIG. 8, the capacitance applied to the bit line BL is different from that applied to the complementary bit line BLB during reading. For example, supposing each of the second and third memory cell blocks 120a and 110b and the second dummy cell block 120D consists of the same number of memory cells, the capacitance CBL applied to the bit line BL is not greatly different from the capacitance CBLB applied to the complementary bit line BLB. Thus, extra load capacitance, i.e., the capacitance C120D caused by the dummy cell block 120D, is applied to the complementary bit line BLB and seriously affects a read time.

In performing a readout operation using the differential sense amplifier 30, the charges stored on the bit line BL and the complementary bit line BLB are discharged with cell currents flowing through the memory cell 14b and the cell current flowing through the dummy cells M21D and M22D, respectively. As a result, a potential difference is created between the bit line BL and the complementary bit line BLB and then amplified using the amplifier 30.

In this case, a potential variation on the complementary bit line BLB, to which the dummy cells M21D and M22D are connected, is preferably a median between a potential variation on the bit line BL, to which a memory cell being erased is connected, and a potential variation on the bit line BL, to which a memory cell being written is connected. For example, suppose a constant cell current flows through the memory cell M14b and a cell current flowing through the dummy cells M21D and M22D is half of the cell current flowing through the memory cell M14b. And also suppose the load capacitances applied to the bit line BL and the complementary bit line BLB are equal to each other. In that case, a potential variation $\Delta V$ after a predetermined time $\Delta t$ has passed since the start of discharge is given by the following Equation 1 by modifying a relationship $I=C(dV/dt)$:

$$\Delta V = (\Delta t/C) \cdot I \quad (1)$$

where V, I, C and t represent voltage, current, capacitance and time, respectively.

Equation 1 shows that the potential variation $\Delta V$ is inversely proportional to the capacitance C and that the time-dependent variation $\Delta t$ is proportional to the capacitance C. As also can be seen from Equation 1, if the additional load capacitance C120D is applied to the complementary bit line BLB, then a read time, i.e., a time taken to cause a predetermined potential variation on the complementary bit line BLB, increases.

FIG. 9 illustrates discharge waveforms of the circuit shown in FIG. 8. In FIG. 9, the axis of abscissas represents time, while the axis of ordinates represents potentials on the bit line BL. VPC represents a pre-charge potential, which is equal to ½ $V_{DD}$. As shown in FIG. 9, since a predetermined drain-source current flows through a memory cell being written as indicated by "1", its potential decreases with time. In contrast, since no drain-source current flows through a memory cell being erased as indicated by "0", its potential does not decrease with time. In FIG. 9, the reference potentials Vref0, Vref1 and Vref2 represent the waveforms of discharge where the dummy cells M21D and M22D are connected to the complementary bit line BLB. Specifically, Vref0 represents an ideal state, Vref1 represents a situation where a high load capacitance C120D is applied and Vref2 represents a situation where a low load capacitance C120D is applied. As can be seen from FIG. 9, if the load capacitance C120D is applied, the waveform of discharge of the complementary bit line BLB deviates from the ideal waveform Vref0 of discharge. This is because a capacitance imbalance is caused between the bit line BL and the complementary bit line BLB. In such a situation, the ideal reference potential Vref0 cannot be generated and it takes an additional time to cause a predetermined potential variation required for reading. As a result, reading cannot be performed at sufficiently high speeds.

SUMMARY OF THE INVENTION

It is therefore an object of the present invention to provide a nonvolatile semiconductor memory device that can perform reading much more accurately and rapidly.

To achieve this object, a dummy cell is provided for each memory cell block in the inventive nonvolatile semiconductor memory device, thereby eliminating the capacitance imbalance between bit line and complementary bit line during data reading. In addition, memory cell blocks connected to the bit and complementary bit lines are activated responsive to mutually different control signals.

Specifically, an inventive nonvolatile semiconductor memory device includes: first and second word lines; first and second bit lines, each intersecting with both of the first and second word lines; first and second memory cell blocks, each including at least one memory cell connected to the first word line; third and fourth memory cell blocks, each including at least one memory cell connected to the second word line; first connection means for connecting the first bit line to the first memory cell block responsive to a first control signal; second connection means for connecting the second bit line to the second memory cell block responsive to a second control signal; third connection means for connecting the first bit line to the third memory cell block responsive to a third control signal; fourth connection means for connecting the second bit line to the fourth memory cell block responsive to a fourth control signal; and an amplifier for inputting or outputting data through the first and second bit lines. The inventive device is characterized in that each said memory cell block includes at least one dummy cell.

In the inventive nonvolatile semiconductor memory device, each of the memory cell blocks, which is connected to the first or second bit line, has the same configuration. Accordingly, almost equal load capacitances are sensed by the amplifier for the first and second bit lines. In addition, the first through fourth memory cell blocks are connected to the first or second bit line by way of the first through fourth connection means operating in response to the first through fourth control signals, respectively. Thus, a pseudo-folded bit line arrangement, which is similar to, but different from, the folded bit line arrangement, can be adopted for the amplifier, thereby reducing noise affecting the first and second bit lines. As a result, the sensitivity of the amplifier can be increased and the read time can be shortened.

In one embodiment of the present invention, the memory cell blocks are preferably provided to have an equal capacitance.

In another embodiment of the present invention, a load capacitance, which is added to the amplifier by the first bit line and the first or third memory cell block connected to the first bit line, is preferably substantially equal to a load capacitance, which is added to the amplifier by the second bit line and the second or fourth memory cell block connected to the second bit line.

In another embodiment of the present invention, in reading out data from the memory cell, which is included in one of the first and third memory cell blocks connected to the first bit line, to the amplifier, the dummy cell, which is included in one of the second and fourth memory cell blocks that is located near the first or third memory cell block including the memory cell being accessed and that is connected to the second bit line, is preferably selected. In such an embodiment, the dummy cell selected is located relatively near the memory cell being accessed and therefore a signal propagation delay or noise caused by the second bit line can be reduced. As a result, reading can be performed much more rapidly and accurately.

In an alternate embodiment of the present invention, in reading out data from the memory cell, which is included in one of the first and third memory cell blocks connected to the first bit line, to the amplifier by activating the first or second word line, the dummy cell, which is included in one of the second and fourth memory cell blocks that is connected to the second bit line and to the first or second word line to which the memory cell being accessed is not connected, is selected.

In still another embodiment, the device further includes multiple cell array units, each including the first, second and third and fourth memory cell blocks. In reading out data from the memory cell, which is included in one of the first and third memory cell blocks connected to the first bit line in one of the cell array units, to the amplifier by activating the first or second word line, the dummy cell, which is included in one of the second and fourth memory cell blocks that is connected to the second bit line in the cell array unit and to the first or second word line to which the memory cell being accessed is not connected, is preferably selected. In such an embodiment, even if there are multiple cell array units each consisting of the first, second, third and fourth memory cell blocks, the dummy cell, which supplies a reference potential for the memory cell being accessed to the amplifier, can be selected correctly from a memory cell block located near the memory cell block including the memory cell being accessed.

In this particular embodiment, each said memory cell block may include multiple dummy cells. When one of the dummy cells is selected, a wire length between the dummy cell selected and the second bit line may be substantially equal to a wire length between the first bit line and the memory cell being accessed and connected to the first bit line.

Alternatively, each said memory cell block may multiple dummy cells. One of the dummy cells, which is located closest to the memory cell being accessed and connected to the first bit line, may be selected.

In still another embodiment, multiple other word lines may be provided for each said memory cell block. Each said memory cell block may include first and second dummy cells, which are connected to odd- and even-numbered ones of the word lines, respectively. The first dummy cell is preferably selected in selecting one of the memory cells connected to an odd-numbered one of the word lines, while the second dummy cell is preferably selected in selecting one of the memory cells connected to an even-numbered one of the word lines. In such an embodiment, even if memory cells connected to an even-numbered word line have characteristics different from those of memory cells connected to an odd-numbered word line due to process conditions, for example, those dummy cells can be provided for the even- or odd-numbered word line. Thus, the electrical characteristics of a memory cell can be matched to those of an associated dummy cell. In other words, each dummy cell can generate a reference potential in accordance with the characteristics of the associated memory cell. That is to say, the reference potential can be generated more precisely during reading. As a result, the sensitivity of the amplifier can be improved and the read time can be shortened.

In still another embodiment, the dummy cells may be located around respective ends of the first through fourth memory cell blocks so as to face each other in a direction in which the bit lines extend.

In yet another embodiment, the first control signal is preferably the same as the fourth control signal, and the second control signal is preferably the same as the third control signal. In such an embodiment, generation of the first and fourth control signals or the second and third control signals can be easily timed with each other. That is to say, it is much easier to synchronize the control signals.

DESCRIPTION OF THE PREFERRED EMBODIMENTS

First, a basic idea of the nonvolatile semiconductor memory device according to the present invention will be described. A well-known memory cell for a nonvolatile semiconductor memory device includes a floating gate between a substrate and a control gate. In the device of this type, information stored can be represented digitally as "0" or "1" on whether or not electrons are retained in the floating gate. Specifically, where electrons are retained in the floating gate, a threshold value of a gate voltage applied to the control gate is relatively high, and therefore substantially no current flows through the memory cell even if a predetermined gate voltage is applied to the control gate. In such a state, "0" is being stored. Conversely, where electrons are not retained in the floating gate, a threshold value of the voltage applied to the control gate is relatively low, and therefore current does flow through the memory cell if the predetermined gate voltage is applied to the control gate. In such a state, "1" is being stored. In this specification, the memory cell in the latter state, in which no electrons are retained, is regarded as being written, or in the "1" state, while the memory cell in the former state, in which electrons are retained, is regarded as being erased, or in the "0" state.

Figure 1:
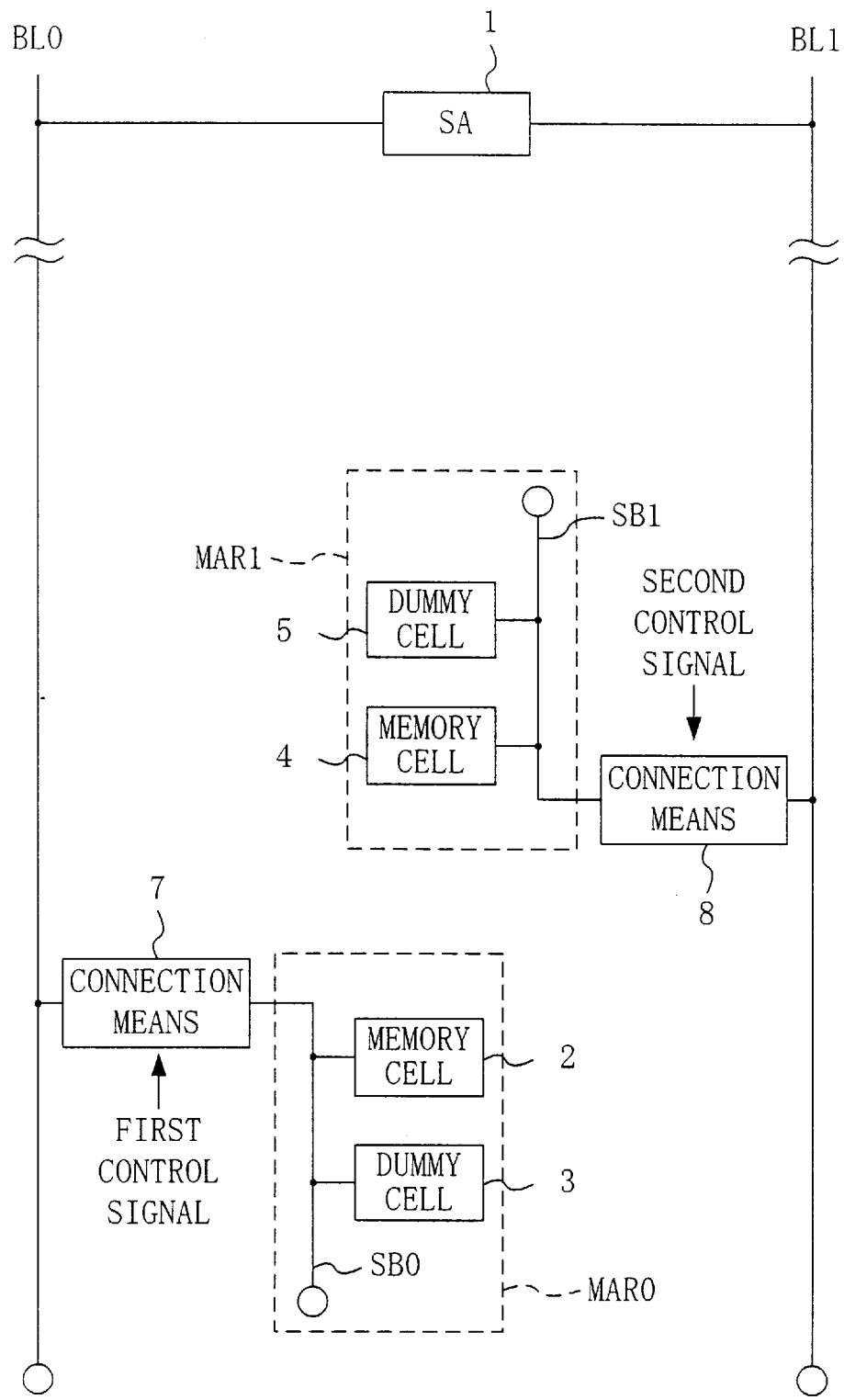
FIG. 1 is a schematic representation illustrating an operating principle of the inventive nonvolatile semiconductor memory device.

FIG. 1 schematically illustrates an operating principle of the inventive nonvolatile semiconductor memory device. As shown in FIG. 1, the device includes sense amplifier (SA) 1, main bit line BL0, complementary bit line BL1 and first and second memory cell blocks MAR0 and MAR1. The main and complementary bit lines BL0 and BL1 are both connected to the sense amplifier 1. While the sense amplifier 1 is operating, a complementary relationship is met between the potentials on the main and complementary bit lines. BL0 and BL1. The first memory cell block MAR0 includes at least one memory cell 2 and at least one dummy cell 3 that are connected in parallel to a first sub-bit line SB0. The second memory cell block MAR1 includes at least one memory cell 4 and at least one dummy cell 5 that are connected in parallel to a second sub-bit line SB1.

The first memory cell block MAR0 is connected to the main bit line BL0 via first connection means 7 receiving a first control signal. The second memory cell block MAR1 is connected to the complementary bit line BL1 via second connection means 8 receiving a second control signal. Although not shown in FIG. 1, control lines are provided for the sense amplifier 1, memory cells 2, 4 and dummy cells 3, 5 to control these independently.

In the inventive nonvolatile semiconductor memory device, the dummy cell 3, 5 is provided for each memory cell block MAR0, MAR1. Thus, while data is being read out from the memory cell 2 or 4, the sense amplifier 1 senses a substantially equal load capacitance from the main and complementary bit lines BL0 and BL1. Accordingly, the imbalance in capacitance between the main and complementary bit lines BL0 and BL1, which is caused when the dummy cells 3 and 5 are provided outside of the memory cell blocks MAR0 and MAR1, can be eliminated.

In the illustrated example, a folded bit line arrangement with excellent noise resistance is adopted. Alternatively, the same effects are attainable if an opened bit line arrangement is used instead.

Embodiment 1

Hereinafter, a first embodiment of the present invention will be described with reference to the accompanying drawings.

Figure 2:
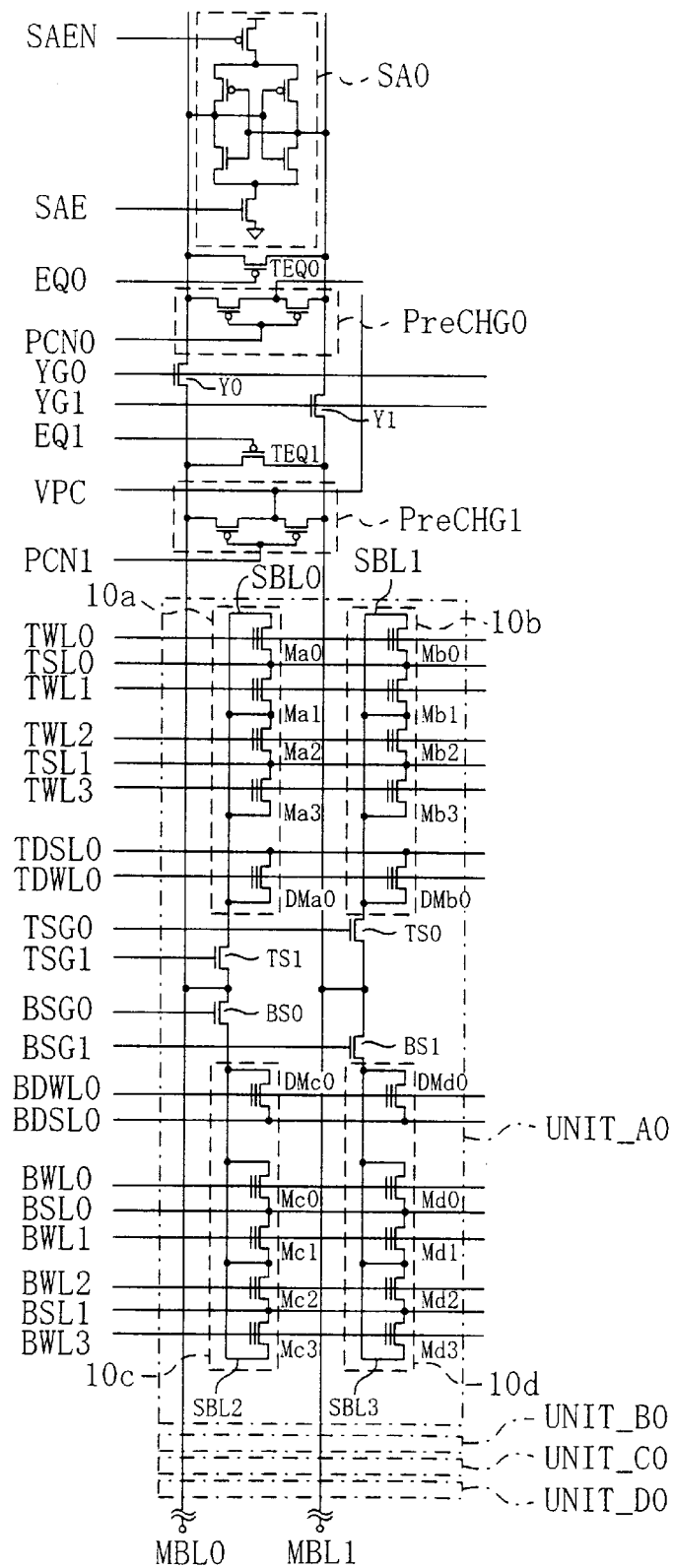
FIG. 2 is a circuit diagram illustrating a nonvolatile semiconductor memory device according to a first embodiment of the present invention.

FIG. 2 illustrates a circuit configuration for a nonvolatile semiconductor memory device according to the first embodiment. In FIG. 2, only four memory cell blocks 10a, 10b, 10c and 10d connected to a single sense amplifier SA0 are illustrated for the sake of simplicity. Actually, though, a great number of sense amplifiers SA0 are provided for the same number of columns. As shown in FIG. 2, the device includes a main bit line MBL0 and a complementary bit line MBL1, which are equivalent to the first and second bit lines as defined in the appended claims. One end of the main bit line MBL0 is connected to the sense amplifier SA0 via a first column gate Y0. On the other hand, one end of the complementary bit line MBL1 is connected to the sense amplifier SA0 via a second column gate Y1 in parallel to the main bit line MBL0. In this case, the first and second column gates Y0 and Y1 receive first and second column gate control signals YG0 and YG1 at their gates, respectively.

The first memory cell block 10a is connected to the main bit line MBL0 by way of a first select gate TS1 receiving a first select signal TSG1. The first select gate TS1 and the first select signal TSG1 correspond to the first connection means and the first control signal as defined in the appended claims, respectively. The second memory cell block 10b is connected to the complementary bit line MBL1 by way of a second select gate TS0 (i.e., the second connection means) receiving a second select signal TSG0 (i.e., the second control signal).

In the same way, the third memory cell block 10c is connected to the main bit line MBL0 by way of a third select gate BS0 (i.e., the third connection means) receiving a third select signal BSG0 (i.e., the third control signal). The fourth memory cell block 10d is connected to the complementary bit line MBL1 by way of a fourth select gate BS1 (i.e., the fourth connection means) receiving a fourth select signal BSG1 (i.e., the fourth control signal).

A first cell array unit UNIT_A0 is made up of these first through fourth memory cell blocks 10a through 10d. Although not illustrated in detail in FIG. 2, three other cell array units UNIT_B0, UNIT_C0 and UNIT_D0 with the same configuration as the first cell array unit UNIT_A0 are further provided according to this embodiment. The first memory cell block 10a consists of: four memory cells Ma0, Ma1, Ma2 and Ma3, which are connected in series together and to word lines TWL0, TWL1, TWL2 and TWL3, respectively; and a dummy cell DMa0 connected to a dummy word line TDWL0. The drains of these memory cells Ma0, Ma1, Ma2 and Ma3 are connected to the first select gate TS1 through a sub-bit line SBL0, while the sources thereof are connected to source lines TSL0 and TSL1. The drain of the dummy cell DMa0 is also connected to the first select gate TS1, while the source thereof is connected to a dummy source line TDSL0.

The second memory cell block 10b consists of: four memory cells Mb0, Mb1, Mb2 and Mb3, which are connected in series together and to the word lines TWL0, TWL1, TWL2 and TWL3, respectively; and a dummy cell DMb0 connected to the dummy word line TDWL0. The drains of these memory cells Mb0, Mb1, Mb2 and Mb3 are connected to the second select gate TS0 through a sub-bit line SBL1, while the sources thereof are connected to the source lines TSL0 and TSL1. The drain of the dummy cell DMb0 is also connected to the second select gate TS0, while the source thereof is connected to the dummy source line TDSL0.

The third and fourth memory cell blocks 10c and 10d, which are connected to the main and complementary bit lines MBL0 and MBL1, have the same configuration as the first and second memory cell blocks 10a and 10b, respectively. Thus, only dummy cells DMc0 and DMd0 included in the third and fourth memory cell blocks 10c and red will be described.

In the third memory cell block 10c, the dummy cell DMc0 is connected to a dummy word line BDWL0. The drain of the dummy cell DMc0 is connected to the third select gate BSC, while the source thereof is connected to a dummy source line BDSL0.

In the fourth memory cell block 10d, the dummy cell DMd0 is also connected to the dummy word line BDWL0. The drain of the dummy cell DMd0 is connected to the fourth select gate BS1, while the source thereof is connected to the dummy source line BDSL0.

The sense amplifier SA0 is an amplifier of a flip-flop type including two CMOS inverters. In the sense amplifier SA0, the input terminal of one of these two inverters is cross-coupled to the output terminal of the other, and vice versa. Also, the sense amplifier SA0 is controlled responsive to a sense amplifier enable signal SAE and its inverted signal SAEN. In the illustrated example, the sense amplifier SA0 is enabled when the signal SAE is high and the signal SAEN is low.

A first pre-charge circuit PreCHG0 and a first equalize transistor TEQ0 are provided between the sense amplifier SA0 and the first and second column gates Y0, Y1 and are both connected to the main and complementary bit lines MBL0 and MBL1. The first pre-charge circuit PreCHG0 includes two p-channel MOS transistors for applying a pre-charge voltage to the main and complementary bit lines MBL0 and MBL1. The first equalize transistor TEQ0 receives a first equalize signal EQ0 at its gate and eliminates the potential difference between the main and complementary bit lines MBL0 and MBL1.

A second pre-charge circuit PreCHG1 and a second equalize transistor TEQ1 are provided between the first and second column gates Y0, Y1 and the first cell array unit UNIT_A0 and are both connected to the main and complementary bit lines MBL0 and MBL1. The second pre-charge circuit PreCHG1 also includes two p-channel MOS transistors for applying a pre-charge voltage to the main and complementary bit lines MBL0 and MBL1. The second equalize transistor TEQI receives a second equalize signal EQ1 at its gate and eliminates the potential difference between the main and complementary bit lines MBL0 and MBL1.

The first and second pre-charge circuits PreCHG0 and PreCHG1 are controlled in response to first and second pre-charge signals PCN0 and PCN1, respectively. While the first or second pre-charge circuit PreCHG0 or PreCHG1 is being enabled, a pre-charge voltage VPC of the pre-charge signal, e.g., a voltage half of the supply voltage $V_{DD}$ (=½ $V_{DD}$), is supplied to the main and complementary bit lines MBL0 and MBL1.

Hereinafter, it will be described with reference to FIG. 3 how the nonvolatile semiconductor memory device with such an arrangement operates.

Figure 3:
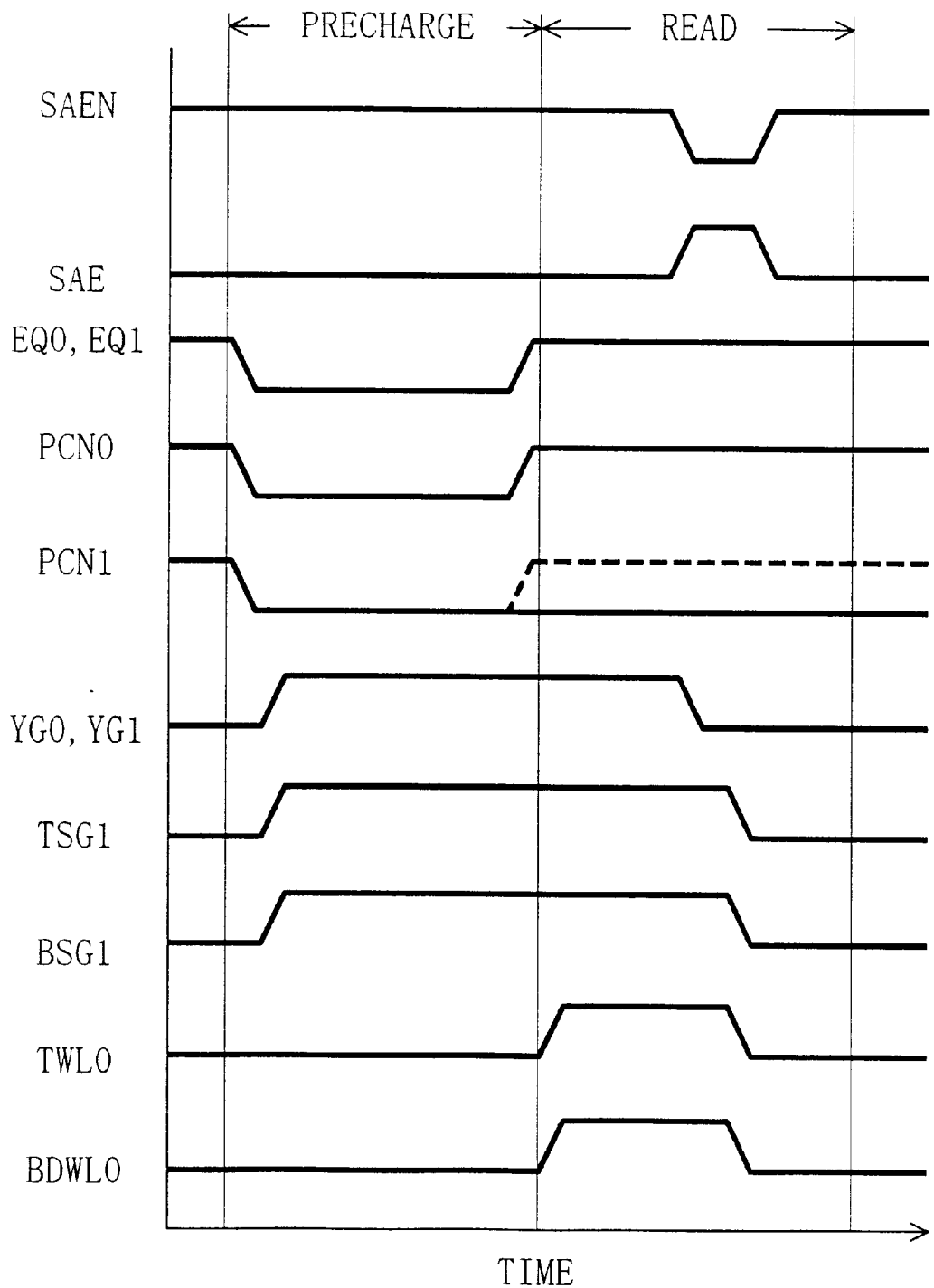
FIG. 3 is a timing diagram illustrating an exemplary operation of the nonvolatile semiconductor memory device according to the first embodiment.

FIG. 3 is a timing diagram illustrating an exemplary read operation performed by the device according to the first embodiment. In the illustrated embodiment, data is read out from the memory cell Ma0 in the first memory cell block 10a connected to the main bit line MBL0 as shown in FIG. 2. In a standby state in which no read or write operation is being performed, the potentials on the sub-bit lines SBL0 through SBL3 connected to the main or complementary bit line MBL0 or MBL1 are kept at the ground level by reset transistors (not shown). Also, even during reading, potentials on the source lines TSL0, TSL1 BSL0, BSL1, TDSL0 and BDSL0 are kept at the ground level.

First, when a READ instruction is externally issued, a pre-charge interval shown in FIG. 3 starts. At the point in time, the first and second pre-charge signals PCN0 and PCN1 are changed from high into low with the word lines TWL0 through TWL3 and BWL0 through BWL3, dummy word lines TDWL0 and BDWL0 and first through fourth select signals TSG1, TSG0, BSG0 and BSG1 all kept deactivated (i.e., low). As a result, the first and second pre-charge circuits PreCHG0 and PreCHG1 are turned ON to raise the potentials on the main and complementary bit lines MBL0 and MBL1 to the pre-charge voltage of ½ $V_{DD}$. In the same manner, the first and second equalize signals EQ0 and EQ1 are changed from high into low, thereby turning the first and second equalize transistors TEQ0 and TEQ1 ON and connecting the main and complementary bit lines MBL0 and MBL1 together. As a result, the potential difference between the main and complementary bit lines MBL0 and MBL1 can be eliminated.

Next, the first and second column gate control signals YG0 and YG1 are changed from low into high to turn the column gates Y0 and Y1 ON and connect the main and complementary bit lines MBL0 and MBL1 to the sense amplifier SA0, respectively. As a result, the input and output terminals of the sense amplifier SA0 are also pre-charged to the same potential level as the main bit line MBL0. By providing this pre-charge interval, the potential difference between the main and complementary bit lines MBL0 and MBL1 can be eliminated before the read operation is started.

In this case, when the first and second column gate control signals YG0 and YG1 are asserted, the first and fourth select signals TSG1 and BSG1 are changed into high such that the first memory cell block b1a including the memory cell Ma0 selected is connected to the main bit line MBL0 and that the fourth memory cell block 10d including the dummy cell DMd0 is connected to the complementary bit line MBL1. It should be noted that the first and fourth select signals TSG1 and BSG1 may be asserted either at the same time with, or after, the assertion of the first and column gate control signals YG0 and YG1.

Subsequently, just before the read interval starts, i.e., immediately before the word line TWL0 connected to the memory cell Ma0 selected is activated, the first and second equalize signals EQ0 and EQ1 are changed into high, thereby disconnecting the main and complementary bit lines MBL0 and MBL1 from each other. In the illustrated embodiment, the first pre-charge signal PCN0 is negated into high, whereas the second pre-charge signal PCN1 is kept asserted or low. Alternatively, reading may be performed even if the second pre-charge signal PCN1, as well as the first pre-charge signal PCN0, is negated into high.

Next, the read operation is carried out by determining whether the charges that were stored on the main and complementary bit lines MBL0 and MBL1 during the pre-charge interval have been discharged due to the currents flowing through the selected memory cell Ma0 and a predetermined dummy cell.

In the illustrated embodiment, the memory cell Ma0 to be accessed in the first memory cell block 10a and the dummy cell DMd0 in the fourth memory cell block 10d are selected by activating the word line TWL0 and dummy word line BDWL0, respectively. In this manner, a dummy cell for supplying a reference potential to the sense amplifier SA0 is selected from the dummy cells DMa0 through DMd0 included in the first cell array unit UNIT_A0, to which the first memory cell block 10a including the selected memory cell Ma0 belongs. In other words, the dummy cell DMd0 included in the fourth memory cell block 10d, which is located near the first memory cell block 10a and connected to the complementary bit line MBL1 and to the word lines different from those connected to the first memory cell block 10a, is selected.

As described above, according to this embodiment, if the memory cell Ma0 in the first memory cell block 10a should be accessed, the fourth select signal BSG1 and the dummy word line BDWL0 are activated to select the dummy cell DMd0 included in the fourth memory cell block 10d belonging to the first cell array unit UNIT_A0 to which the first memory cell block 10a also belongs. As a result, the dummy cell DMd0 closest to the memory cell Ma0 to be accessed is selected from multiple selectable dummy cells. Accordingly, signal propagation delay and increase of noise, which are easily caused during reading if a dummy cell selected is relatively distant from a memory cell selected, can be greatly reduced.

As described above, the second, third and fourth cell array units UNIT_B0, UNIT_C0 and UNIT_D0 with the same configuration as the first cell array unit UNIT_A0 are provided according to this embodiment. Even so, a memory cell and its associated dummy cell supplying a reference potential are selected from a single cell array unit during reading.

In general, an amplifier of the type sensing a read current such as the sense amplifier SA0 determines whether or not pre-charged bit lines have been discharged due to the current flowing through a selected memory cell by comparing the potential levels of the memory cell and its associated dummy cell to each other. In this case, if the selected memory cell is being written, or in the "1" state, then the main bit line MBL0 is discharged (i.e., the potential on the line drops) because a current path leading to the ground is formed. On the other hand, if the selected memory cell is being erased, or in the "0" state, then the potential on the main bit line MBL0 is kept approximately equal to the pre-charge level because no current path is formed. The complementary bit line MBL1 connected to the dummy cell is also discharged (i.e., the potential on the line drops) due to the current flowing through the dummy cell. The waveform of discharge of the complementary bit line MBL1 is defined just at the median between the waveform of discharge of the main bit line MBL0 connected to a memory cell being erased and that of the main bit line MBL0 connected to a memory cell being written.

Subsequently, after the potential difference between the main and complementary bit lines MBL0 and MBL1 has got ready to be sensed by the sense amplifier SA0, the sense amplifier enable signal SAE and its inverted signal SAEN are asserted into high and low, respectively, thereby enabling the sense amplifier SA0, amplifying the potential difference between the main and complementary bit lines MBL0 and MBL1 and starting to read out the data. Next, when or after the sense amplifier enable signal SAE is asserted into high, the first and second column gate control signals YG0 and YG1 are negated into low, thereby turning the first and second column gates Y0 and Y1 OFF. As a result, the sense amplifier SA0 is disconnected from the main and complementary bit lines MBL0 and MBL1.

As described above, according to this embodiment, the dummy cells DMa0, DMb0, DMc0 and DMd0, which supply a reference potential to the sense amplifier SA0 to read out data from a selected memory cell, are provided for the first through fourth memory cell blocks 10a, 10b, 10c and 10d, respectively. And each of these memory cell blocks 10a, 10b, 10c and 10d, which are connected to the main or complementary bit line MBL0 or MBL1, has the same circuit configuration. Thus, a pair of memory cell blocks, which are connected to the main and complementary bit lines MBL0 and MBL1, respectively, and have the same configuration, are selected during reading. As a result, the load capacitances applied to the main and complementary bit lines MBL0 and MBL1 can be substantially equal to each other. Accordingly, if these memory cell blocks 10a through 10d have the same configuration, the capacitances caused by the dummy cells DMa0, DMb0, DMc0 and DMd0 are preferably substantially equal to each other.

The nonvolatile semiconductor memory device according to this embodiment further has the following two features.

Firstly, the dummy cells DMa0 through DMd0 are located around respective ends of the memory cell blocks 10a through 10d so as to face each other in the direction in which the main and complementary bit lines MBL0 and MBL1 extend. Also, in the illustrated embodiment, the first and third select gates TS1 and BS0 are placed between the first and third memory cell blocks 10a and 10c and the second and fourth select gates TS0 and BS1 are placed between the second and fourth memory cell blocks 10b and 10d. Thus, the first dummy cell DMa0, for example, can be disposed adjacent to the first select gate TS1 for controlling connection between the main bit line MBL0 and the first memory cell block 10a to which the first dummy cell DMa0 itself belongs. The same placement is applicable to the other three dummy cells DMb0, DMc0 and DMd0.

In this manner, the dummy cells DMa0 through DMd0 are placed around respective ends of the memory cell blocks 10a through 10d so as to face each other in the direction in which the main and complementary bit lines MBL0 and MBL1 extend. That is to say, since these dummy cells are formed to be adjacent to each other during the fabrication process of the device, the operating characteristics (e.g., threshold voltages) of the dummy cells are less likely to vary among the lots of the fabrication process.

Also, the wire length between the memory cell selected and the sense amplifier SA0 by way of the main bit line MBL0 is not so different from the wire length between the dummy cell selected and the sense amplifier SA0 by way of the complementary bit line MBL1. For example, suppose the memory cell Ma0 and the dummy cell DMd0 have been selected from the first and fourth memory cell blocks 10a and 10d, respectively. The memory cell Ma0 is located closer to the sense amplifier SA0 than any other cell in the memory cell block 10a, but is connected to the main bit line MBL0 via the first select gate TS1 over the longest part of the sub-bit line SBL0. The fourth memory cell block 10d is distant from the sense amplifier SA0 because the second memory cell block 10b is interposed therebetween. But the dummy cell DMd0 is connected to the complementary bit line MBL1 via the fourth select gate BS1 over the shortest part of the sub-bit line SBL3. Thus, the wire length between the memory cell selected and the sense amplifier SA0 or between the dummy cell selected and the sense amplifier SA0 does not depend on the location of the memory or dummy cell, i.e., whether or not the cell is close to the sense amplifier SA0.

The first and third select gates TS1 and BS0 connected to the main bit line MBL0 are provided between the first and third memory cell blocks 10a and 10c and the second and fourth select gates TS0 and BS1 connected to the complementary bit line MBL1 are provided between the second and fourth memory cell blocks 10b and 10d. Thus, the distance between the memory cell selected and the sense amplifier SA0 is not so different from the distance between the dummy cell selected and the sense amplifier SA. As a result, the signal propagation delay and noise can be both reduced.

Furthermore, the first and third select gates TS1 and BS0 and the second and fourth select gates TS0 and BS1 are placed to be adjacent to each other between the memory cell blocks 10a and 10c and between the memory cell blocks 10b and 10d, respectively. Accordingly, the first and fourth select gate signals TSG1 and BSG1 or the second and third select gate signals TSG0 and BSG0 can be the same signal. As a result, it is easier to synchronize, or to time the generation of, these signals. In addition, the area occupied by the associated signal lines can be reduced and the circuit configuration can be simplified.

Secondly, a pseudo-folded bit line arrangement, which is similar to, but different from, the known folded bit line arrangement, is adopted according to this embodiment.

Hereinafter, the pseudo-folded bit line arrangement according to this embodiment will be described in detail.

First, a known bit line folding technique applicable to a DRAM, for example, will be briefly described. In a folded bit line arrangement in which multiple word lines and bit lines are arranged to intersect with each other, an adjacent pair of bit lines, which consists of a bit line and a complementary bit line, are used as two input lines for each sense amplifier. This bit line folding technique is applicable particularly effectively to a differential sense amplifier. In that case, the sense amplifier can sense the noise components involved with the pair of bit lines as having almost the same phase thanks to the symmetrical layout. Accordingly, the sense amplifier can eliminate the noise components from its input signals much more satisfactorily.

In a DRAM in general, a memory cell consists of one capacitor and one switching transistor, and a memory cell connected to a bit line and another memory cell connected to a complementary bit line are not connected to the same word line. That is to say, since only one memory cell is activated per pair of bit lines, the bit line folding technique is applicable to a DRAM.

However, the folded bit line arrangement for a DRAM is not applicable to a nonvolatile semiconductor memory device as it is. This is because if the arrangement in which multiple word lines and bit lines intersect with each other is applied to the nonvolatile semiconductor memory device, a pair of memory cells, which are adjacent to each other between a pair of bit lines, are activated simultaneously per word line. thus, according to this embodiment, a pseudo-folded bit line arrangement with the following features is adopted:

(1) The main and complementary bit lines are arranged by the bit line folding technique;
(2) Each cell array unit is divided into multiple memory cell blocks and a sub-bit line is provided for each of the memory cell blocks divided;
(3) A dummy cell for generating a reference potential is provided for each sub-bit line in a memory cell block and a select gate to be connected to a main or complementary bit line is provided for each memory cell block; and
(4) When a memory cell belonging to a memory cell block is selected, a dummy cell, belonging to another memory cell block connected to a different word line and a different bit line, is selected.

The pseudo-folded bit line arrangement according to this embodiment attains the following effects:

(a) Since the main and complementary bit lines are arranged by the bit line folding technique, the device is more resistant to noise of the same phase.
(b) A sub-bit line in each memory cell block can be shorter because the sub-bit line is placed by the opened bit line arrangement. In addition, since a pair of sub-bit lines, e.g., first and fourth sub-bit lines SBL0 and SBL3 or second and third sub-bit lines SBL1 and SBL2, can be disposed to be close to each other, these sub-bit lines are less affected by noise to be differential inputs;
(c) As described above, the wire length between a dummy cell selected and the sense amplifier is not so different from the wire length between a memory cell selected and the sense amplifier. The difference in length is at most approximately equal to the length of a sub-bit line. Also, the difference in length between sub-bit lines is at most equal to twice the length of the shortest sub-bit line.
(d) As also described above, the generation of control signals for respective select gates can be timed easily.

By adopting such a pseudo-folded bit line arrangement, even a nonvolatile semiconductor memory device can attain noise resistance characteristics comparable to those of a DRAM with the folded bit line arrangement. As a result, the reference potential can be generated much more precisely, the sensitivity of the sense amplifier can be improved greatly and the read time can be shortened considerably.

Figure 9:
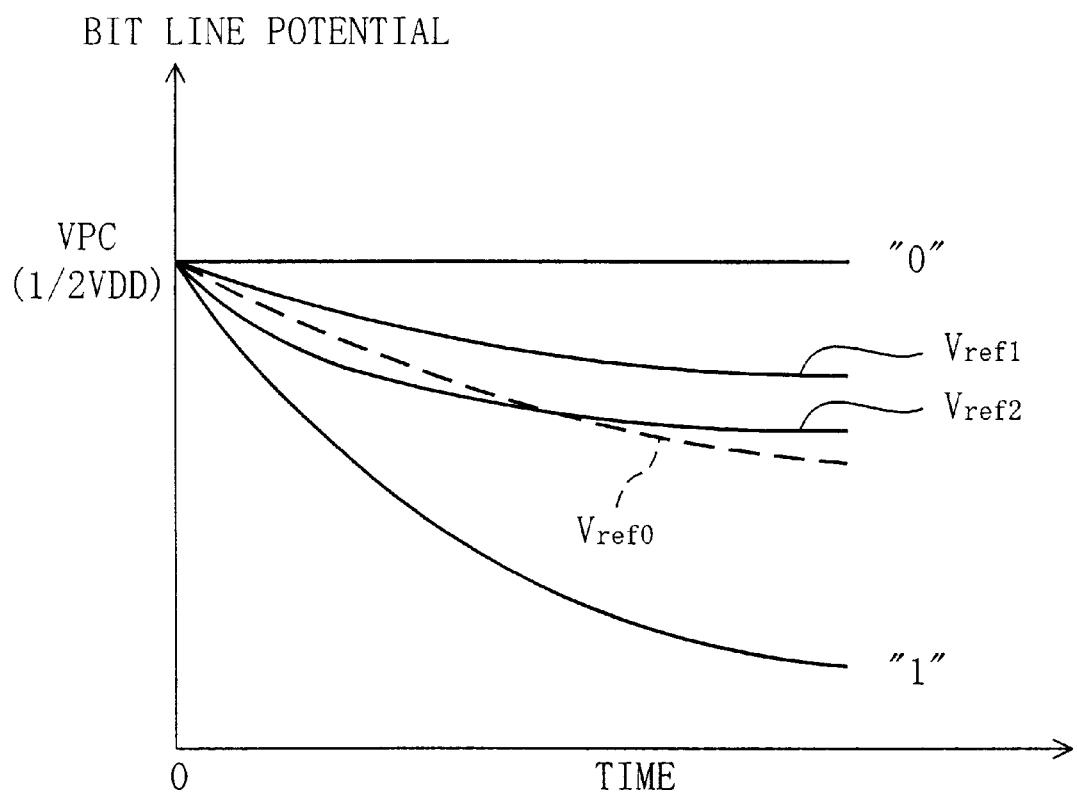
FIG. 9 is a graph illustrating waveforms of discharge in the conventional folded bit line arrangement.

In the foregoing embodiment, each of the dummy cells DMa0 through DMd0 is implemented as a single memory cell. Alternatively, each dummy cell may be a serial connection of two memory cells or the threshold voltage of each dummy cell may be adjusted such that the dummy cell current is approximately a median between the current flowing through a memory cell being written and one being erased. That is to say, the dummy cell may have any configuration so long as the dummy cell current generates the reference potential Vref0 as indicated by the broken line in FIG. 9. Accordingly, the dummy cell does not have to be implemented as a memory cell, but may be a serial connection of two n-channel MOS transistors, for example.

Embodiment 2

Hereinafter, a second embodiment of the present invention will be described with reference to the accompanying drawings.

Figure 4:
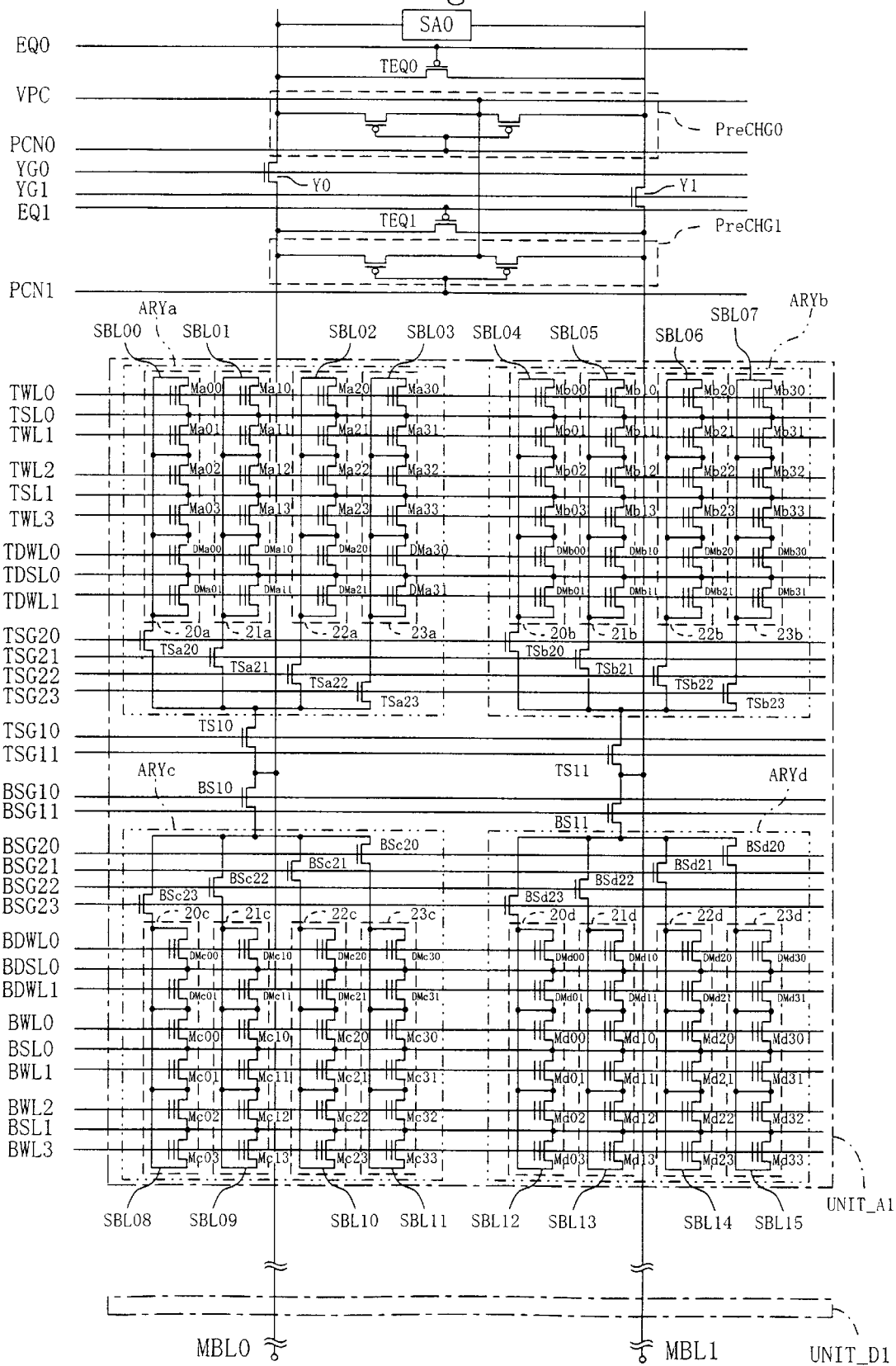
FIG. 4 is a circuit diagram illustrating a nonvolatile semiconductor memory device according to a second embodiment of the present invention.

FIG. 4 illustrates a circuit configuration for a nonvolatile semiconductor memory device according to the second embodiment. The second embodiment is extension of the first embodiment. Thus, in FIG. 4, the same components as those illustrated in FIG. 2 are identified by the same reference numerals and the description thereof will be omitted herein. In the device of the second embodiment illustrated in FIG. 4, a first cell array unit UNIT_A1 includes first through fourth cell arrays ARYa, ARYb, ARYc and ARYd, each consisting of first through fourth memory cell blocks 20a through 23a, 20b through 23b, 20c through 23c and 20d through 23d. The memory cell blocks 20a through 23a and 20c through 23c are connected in parallel to the main bit line MBL0, while the memory cell blocks 20b through 23b and 20d through 23d are connected in parallel to the complementary bit line MBL1. Although not shown in FIG. 4, each of the second, third and fourth cell array units UNIT_B1, UNIT_C1 and UNIT_D1 has the same configuration as the first cell array unit UNIT_A1.

Figure 5:
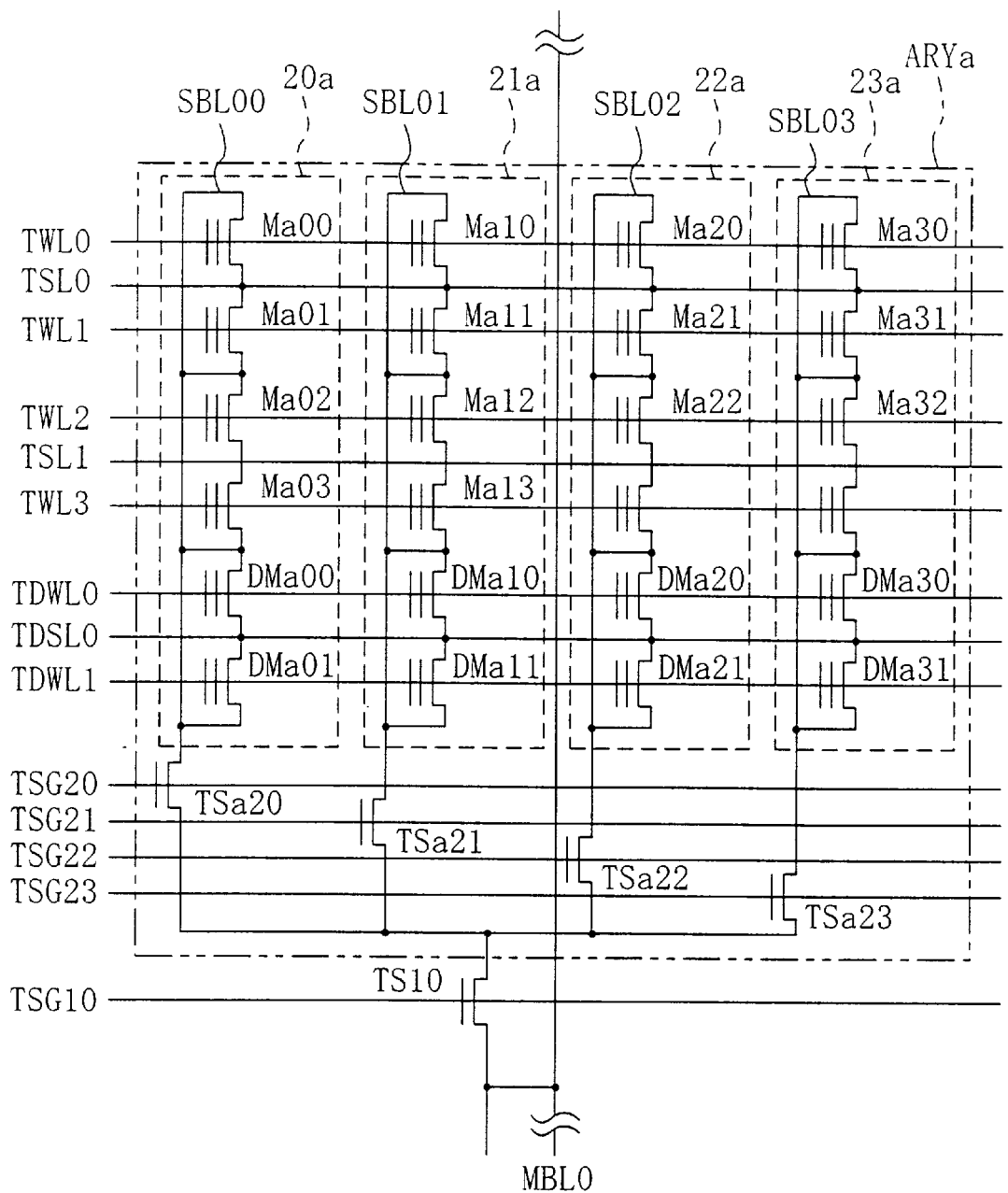
FIG. 5 is a circuit diagram illustrating a cell array in the nonvolatile semiconductor memory device according to the second embodiment.

FIG. 5 illustrates a circuit configuration for the first cell array ARYa. As shown in FIG. 5, the first memory cell block 20a of the first cell array ARYa includes four memory cells Ma00, Ma01, Ma02 and Ma03, which are connected in series together and to word lines TWL0, TWL1, TWL2 and TWL3, respectively. The first memory cell block 20a further includes two dummy cells DMa00 and DMa01, which are connected in series together and to dummy word lines TDWL0 and TDWL1, respectively. The drains of the memory cells Ma00, Ma01, Ma02 and Ma03 and the dummy cells DMa00 and DMa01 are connected to the first select gate TS10 through a first sub-bit line SBL00 and first select transistor TSa20. The first select gate TS10 receives a first select signal TSG10 at its gate. The sources of the memory cells Ma00, Ma01, Ma02 and Ma03 are connected to source lines TSL0 and TSL1, while the sources of the dummy cells DMa00 and DMa01 are connected in common to a dummy source line TDSL0.

In the same way, the second memory cell block 21a includes four memory cells Ma10, Ma11, Ma12 and Ma13, which are connected in series together and to the word lines TWL0, TWL1, TWL2 and TWL3, respectively. The second memory cell block 21a further includes two dummy cells DMa10 and DMa11, which are connected in series together and to the dummy word lines TDWL0 and TDWL1, respectively. The drains of the memory cells Ma10, Ma11, Ma12 and Ma13 and the dummy cells DMa10 and DMa11 are connected to the first select gate TS10 through a second sub-bit line SBL01 and second select transistor TSa21. The sources of the memory cells Ma10, Ma11, Ma12 and Ma13 are connected to the source lines TSL0 and TSL1, while the sources of the dummy cells DMa10 and DMa11 are connected in common to the dummy source line TDSL0. The third and fourth memory cell blocks 22a and 23a also has the same configuration as the first and second memory cell blocks 20a and 21a and the description thereof will be omitted herein.

The first select transistor TSa20, which selectively connects the first select gate TS10 to the first memory cell block 20a, receives a first in-array select signal TSG20. In the same way, the second, third and fourth select transistors TSa21, TSa22 and TSa23, which selectively connect the first select gate TS10 to the second, third and fourth memory cell blocks 21a, 22a and 23a, receive second, third and fourth in-array select signals TSG21, TSG22 and TSG23, respectively.

Also, as shown in FIG. 4, each of the second, third and fourth cell arrays ARYb, ARYc and ARYd has the same circuit configuration as the first cell array ARYa. Moreover, the dummy cells DMa00, DMa01, DMa10, DMa11, DMa20, DMa21, DMa30 and DMa31 in the respective memory cell blocks 20a, 21a, 22a and 23a of the first cell array ARYa and the dummy cells DMc00, DMc01, DMc10, DMc11, DMc20, DMc21, DMc30 and DMc31 in the respective memory cell blocks 20c, 21c, 22c and 23c of the third cell array ARYc are placed around respective ends of the first and third cell arrays ARYa and ARYc to face each other in the direction in which the main bit line MBL0 extends. In the same way, the dummy cells DMb00, DMb01, DMb10, DMb11, DMb20, DMb21, DMb30 and DMb31 of the second cell array ARYb and the dummy cells DMd00, DMd01, DMd10, DMd11, DMd20, DMd21, DMd30 and DMd31 of the fourth cell array ARYd are placed around respective ends of the second and fourth cell arrays ARYb and ARYd to face each other in the direction in which the complementary bit line MBL1 extends.

Hereinafter, it will be described with reference to FIG. 6 how the nonvolatile semiconductor memory device with such a configuration operates.

Figure 6:
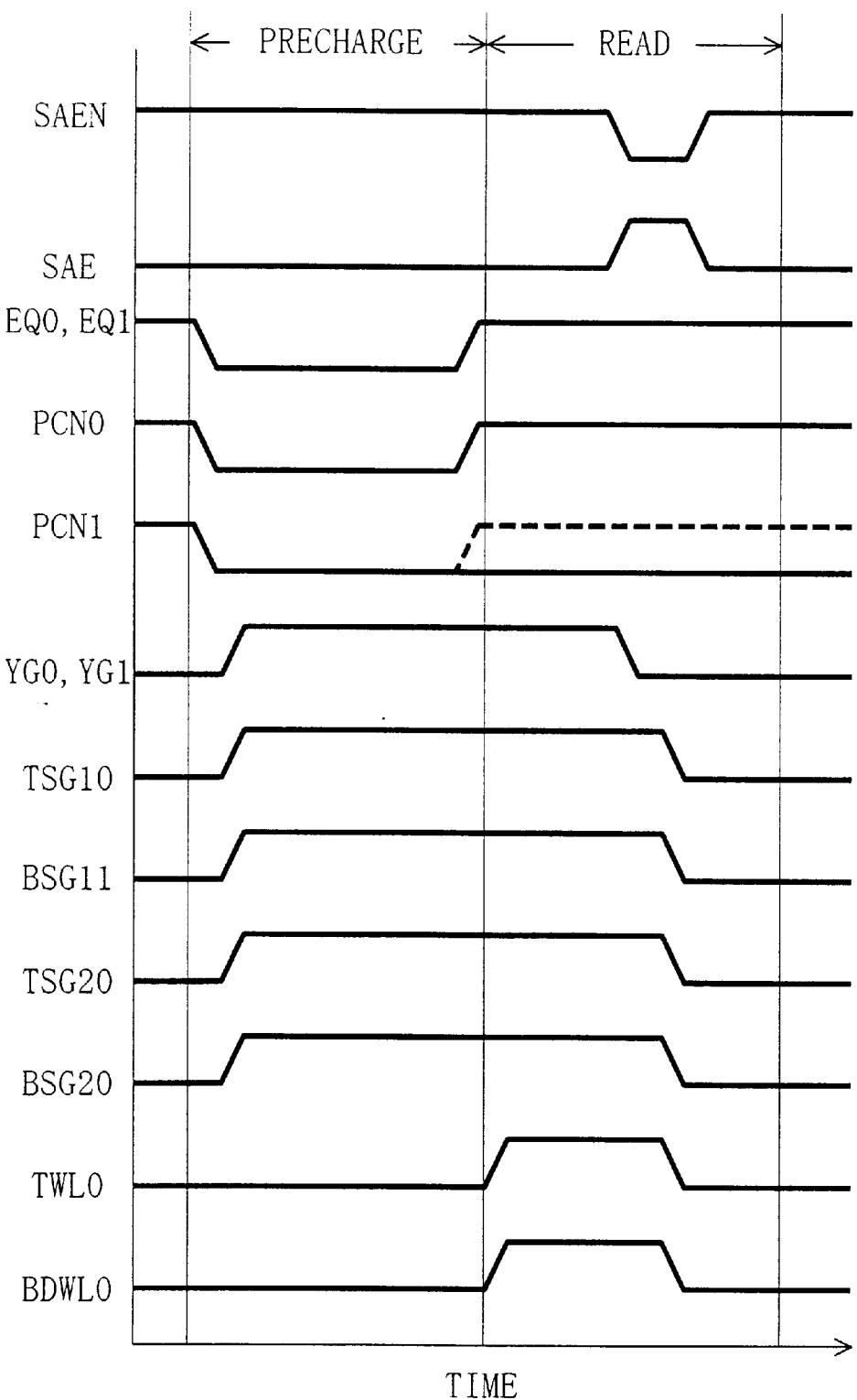
FIG. 6 is a timing diagram illustrating an exemplary operation of the nonvolatile semiconductor memory device according to the second embodiment.
Figure 7:
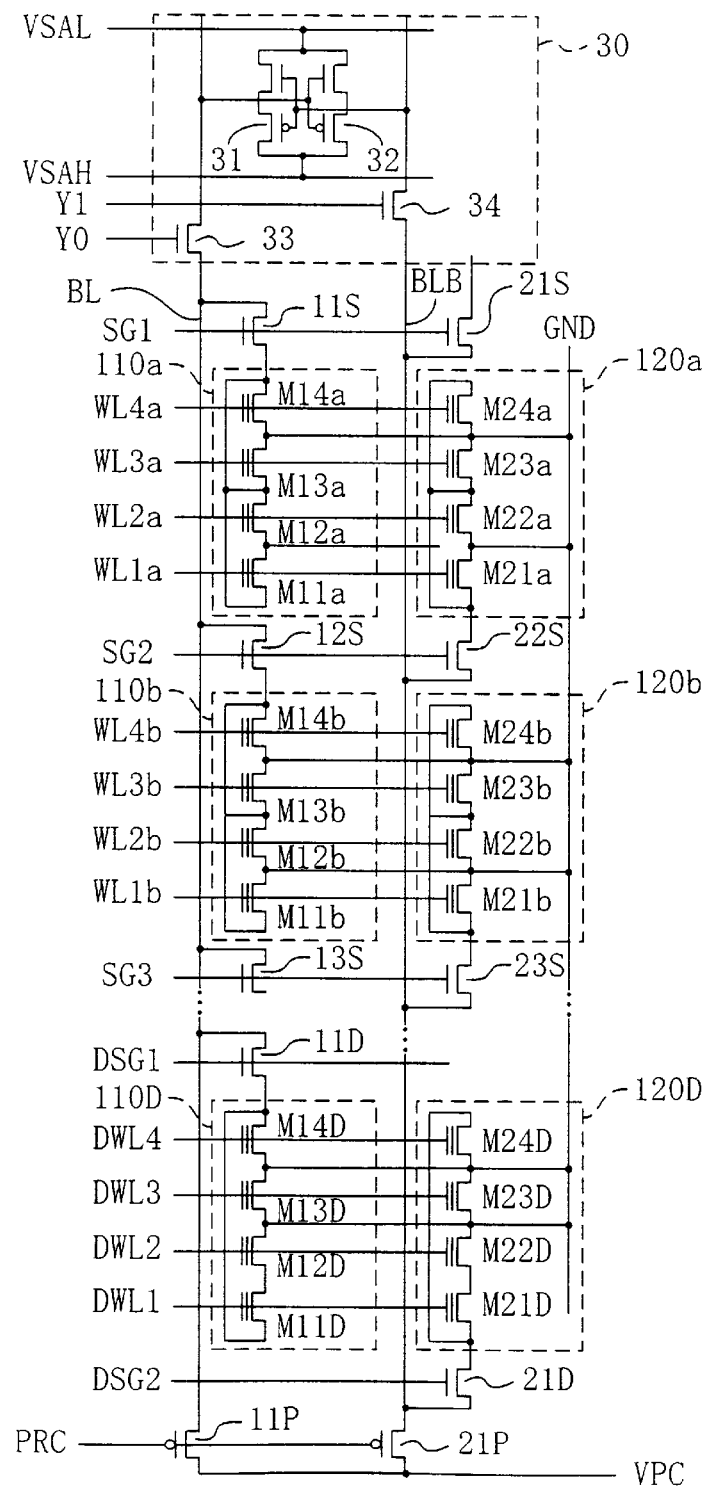
FIG. 7 is a circuit diagram illustrating a known nonvolatile semiconductor memory device with a folded bit line arrangement.
Figure 8:
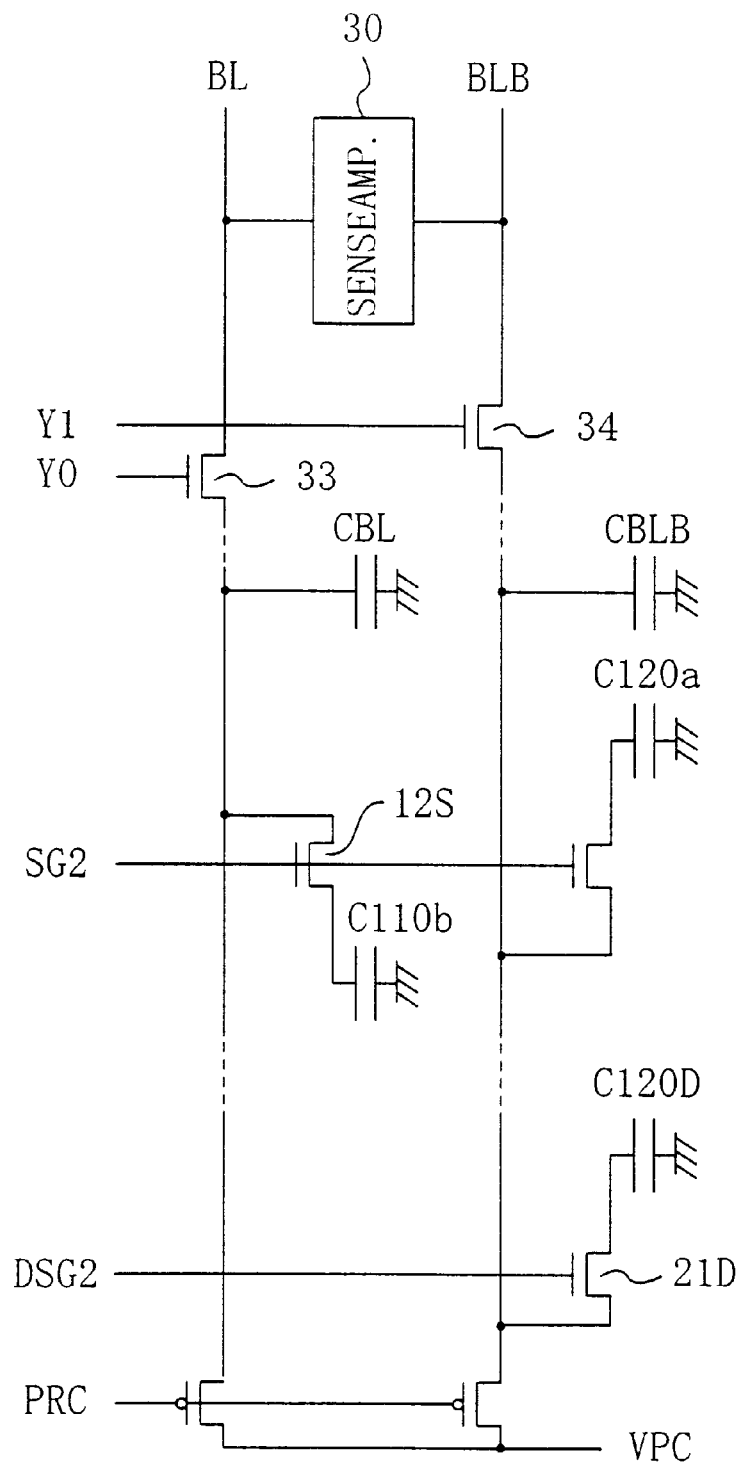
FIG. 8 is a schematic representation illustrating load capacitance components in the known nonvolatile semiconductor memory device.

FIG. 6 is a timing diagram illustrating an exemplary read operation performed by the device according to the second embodiment. In the illustrated embodiment, data is read out from the memory cell Ma00 in the first memory cell block 20a of the first cell array ARYa connected to the main bit line MBL0 as shown in FIG. 4.

First, structural difference between the first and second embodiments will be described. In the device of the first embodiment shown in FIG. 2, if the word line TWL0 has been activated, for example, the two memory cells Ma0 and Mb0 are activated at the same time. In the device of the second embodiment shown in FIG. 5 on the other hand, if the word line TWL0 has been activated, for example, the four memory cells Ma00, Ma10, Ma20 and Ma30 are activated at the same time. The same statement is also applicable to the dummy cells.

In the device of the second embodiment, two dummy word lines are provided per cell block. For example, the first cell array ARYa is provided with the dummy word line TDWL0, which is disposed on an even-numbered row and connected to the four dummy cells DMa00, DMa10, DMa20 and DMa30, and the dummy word line TDWL1, which is disposed on an odd-numbered row and connected to the four dummy cells DMa01, DMa11, DMa21 and DMa31. It should be noted that a word line is identified as "even-numbered" or "odd-numbered" by the subscript attached to the end thereof. As can be seen, the memory and dummy cells are arranged differently between the first and second embodiments. Thus, the following description will be focused on how a dummy cell for supplying a reference potential to the sense amplifier SA0 is selected in accessing the memory cell Ma00. In this embodiment, the procedure of selecting an appropriate dummy cell will be called "narrowing".

First, when a READ instruction that the memory cell Ma00 belonging to the first memory cell block 20a of the first cell array ARYa in the first cell array unit UNIT_A1 should be accessed is externally issued, a pre-charge interval shown in FIG. 6 starts. At the beginning, the first and second pre-charge signals PCN0 and PCN1 are changed from high into low with the word lines TWL0 through TWL3 and BWL0 through BWL3, dummy word lines TDWL0, TDWL1, BDWL0 and BDWL1 and first through fourth select signals TSG10, TSG11, BSG10 and BSG11 all kept deactivated (i.e., low). At the same time, the first and second equalize signals EQ0 and EQ1 are changed from high into low, thereby turning the first and second equalize transistors TEQ0 and TEQ1 ON.

Next, the first and second column gate control signals YG0 and YG1 are changed from low into high to turn the column gates Y0 and Y1 ON and connect the main and complementary bit lines MBL0 and MBL1 to the sense amplifier SA0. As a result, the input and output terminals of the sense amplifier SA0 are also pre-charged to the same potential level as the main bit line MBL0.

At the same time, the first select signal TSG10 is asserted such that the first cell array ARYa including the first memory cell block 20a selected is connected to the main bit line MBL0. Simultaneously, the first in-array select signal TSG20 is also asserted such that the memory cell Ma00 selected is connected to the first select gate TS10. In the illustrated embodiment, a dummy cell is selected from the fourth cell array ARYd. Thus, the fourth select signal BSG11 is asserted such that the fourth cell array ARYd is connected to the complementary bit line MBL1. At the same time, the first in-array select signal BSG20 is also asserted.

In the succeeding read interval, the same operations are performed as in the first embodiment.

Hereinafter, the procedure of selecting a dummy cell from the fourth cell array ARYd in response to the first in-array select signal BSG20 will be described.

First Narrowing Process Step

First, the fourth cell array ARYd, which is located close to the first cell array ARYa and connected to the complementary bit line MBL1 and to word lines different from those connected to the first cell array ARYa, is selected from the other cell arrays belonging to the first cell array unit UNIT_A1. As a result, the candidates are narrowed down to the eight dummy cells DMd00 through DMd31 included in the first through fourth memory cell blocks 20d, 21d, 22d and 23d belonging to the fourth cell array ARYd.

Second Narrowing Process Step

Next, the eight candidate dummy cells DMd00 through DMd31 are further narrowed down by finding such dummy cells as minimizing the difference between the wire length from the first memory cell block 20a selected to the main bit line MBL0 and the wire length from a memory cell block including the candidate dummy cell to the complementary bit line MBL1. In the illustrated embodiment, the first memory cell block 20a selected is not adjacent to the main bit line MBL0. Thus, the candidates are narrowed down to the four dummy cells DMd00, DMd01, DMd30 and DMd31 included in the first and fourth memory cell blocks 20d and 23d that are not adjacent to the complementary bit line MBL1.

As a result, the total wire length of parts of the main bit line MBL0 and the first sub-bit line SBL00 that should be passed to access the memory cell Ma00 selected is not so different from the total wire length of parts of the complementary bit line MBL1 and the first or fourth sub-bit line SBL12 or SBL15 that should be passed to access the candidate dummy cell DMd00, DMd01, DMd30 or DMd31. Thus, the coupled capacitance between the main bit line MBL0 and the sub-bit line SBL00 can be substantially matched to the coupled capacitance between the complementary bit line MBL1 and the sub-bit line SBL12 or SBL15. As a result, variation in line capacitance between the main and complementary bit lines MBL0 and MBL1 can be reduced during reading.

Third Narrowing Process Step

The third narrowing process step is effectively applicable to a situation like this where multiple dummy word lines are provided for a single cell array. That is to say, difference in characteristics of memory and dummy cells, which is caused depending on whether a word line is disposed on an even- or odd-numbered row, can be suppressed.

More specifically, the memory cell Ma00 to be accessed is connected to an even-numbered word line TWL0. Thus, the four remaining candidate dummy cells DMd00, DMd01, DMd30 and DMd31 are narrowed down to the two DMd00 and DMd30 that are connected to an even-numbered dummy word line BDWL0 in the fourth cell array ARYd. This selection corresponds to the example illustrated in FIG. 6, in which the word line TWL0 and the dummy word line BDWL0 are activated simultaneously during the read interval. Alternatively, if the memory cell to be accessed is connected to an odd-numbered word line, e.g., the word line TWL1, then the candidates are narrowed down to the two dummy cells DMd01 and DMd31 that are connected to the odd-numbered dummy word line BDWL1 in the fourth cell array ARYd.

Next, an arbitrary one is selected from the two remaining candidate dummy cells DMd00 and DMd30. For example, the dummy cell DMd30 belonging to the fourth memory cell block 23d may be selected.

It should be noted that these first through third narrowing process steps sequentially indicate a design procedure. Thus, these process steps are not performed every time the nonvolatile semiconductor memory device performs a read operation actually. That is to say, this procedure should be preprogrammed such that a unique dummy cell can be selected at the same time with address encoding and decoding at respective memory cells.

As described above, the same effects as those of the first embodiment are attainable by the second embodiment. Also, even if characteristics of memory cells that are adjacent to each other on even- and odd-numbered rows are different from each other due to process conditions, e.g., doping conditions for a semiconductor substrate, the characteristics can be matched between memory and dummy cells selected.

If these cell arrays ARYa through ARYd have the same configuration, the capacitance formed between each pair of dummy cells is preferably substantially constant.

In the foregoing embodiment, four memory cells are connected in parallel to the main or complementary bit line MBL0 or MBL1 and activated through a single word line. Alternatively, any other appropriately number of memory cells may be connected in view of storage capacity and specifications.

Although not stated explicitly, the present invention is effectively applicable to various memories like EEPROM or flash EEPROM with a differential sense amplifier or to an integrated circuit unit with the memory such as a microcomputer.

What is claimed is:

1. A nonvolatile semiconductor memory device comprising:

first and second word lines;

first and second bit lines, each said bit line intersecting with both of the first and second word lines;

first and second memory cell blocks, each of the first and second memory cell blocks including at least one memory cell connected to the first word line;

third and fourth memory cell blocks, each of the third and fourth memory cell blocks including at least one memory cell connected to the second word line;

first connection means for connecting the first bit line to the first memory cell block responsive to a first control signal;

second connection means for connecting the second bit line to the second memory cell block responsive to a second control signal;

third connection means for connecting the first bit line to the third memory cell block responsive to a third control signal;

fourth connection means for connecting the second bit line to the fourth memory cell block responsive to a fourth control signal; and an amplifier for inputting or outputting data through the first and second bit lines, wherein each said memory cell block includes at least one dummy cell.

2. The device of claim 1, wherein the memory cell blocks are provided to have an equal capacitance.

3. The device of claim 1, wherein a load capacitance, which is added to the amplifier by the first bit line and the first or third memory cell block connected to the first bit line, is substantially equal to a load capacitance, which is added to the amplifier by the second bit line and the second or fourth memory cell block connected to the second bit line.

4. The device of claim 1, wherein in reading out data from the memory cell, which is included in one of the first and third memory cell blocks connected to the first bit line, to the amplifier, the dummy cell, which is included in one of the second and fourth memory cell blocks that is located near the first or third memory cell block including the memory cell being accessed and that is connected to the second bit line, is selected.

5. The device of claim 1, wherein in reading out data from the memory cell, which is included in one of the first and third memory cell blocks connected to the first bit line, to the amplifier by activating the first or second word line, the dummy cell, which is included in one of the second and fourth memory cell blocks that is connected to the second bit line and to the first or second word line to which the memory cell being accessed is not connected, is selected.

6. The device of claim 1, further comprising multiple cell array units, each said cell array unit including the first, second and third and fourth memory cell blocks, wherein in reading out data from the memory cell, which is included in one of the first and third memory cell blocks connected to the first bit line in one of the cell array units, to the amplifier by activating the first or second word line, the dummy cell, which is included in one of the second and fourth memory cell blocks that is connected to the second bit line in the cell array unit and to the first or second word line to which the memory cell being accessed is not connected, is selected.

7. The device of claim 6, wherein each said memory cell block comprises multiple dummy cells, and wherein when one of the dummy cells is selected, a wire length between the dummy cell selected and the second bit line is substantially equal to a wire length between the first bit line and the memory cell being accessed and connected to the first bit line.

8. The device of claim 6, wherein each said memory cell block comprises multiple dummy cells, and wherein one of the dummy cells, which is located closest to the memory cell being accessed and connected to the first bit line, is selected.

9. The device of claim 1, wherein multiple other word lines are provided for each said memory cell block, and wherein each said memory cell block includes first and second dummy cells, the first dummy cell being connected to an odd-numbered one of the word lines, the second dummy cell being connected to an even-numbered one of the word lines, and wherein the first dummy cell is selected in selecting one of the memory cells connected to an odd-numbered one of the word lines, while the second dummy cell is selected in selecting one of the memory cells connected to an even-numbered one of the word lines.

10. The device of claim 1, wherein the dummy cells are located around respective ends of the first through fourth memory cell blocks so as to face each other in a direction in which the bit lines extend.

11. The device of claim 1, wherein the first control signal is the same as the fourth control signal, and the second control signal is the same as the third control signal.

* * * * *